(12) United States Patent
Schmidhammer et al.

(10) Patent No.: US 9,130,534 B2
(45) Date of Patent: Sep. 8, 2015

(54) IMPEDANCE MATCHING CIRCUIT CAPABLE OF BROADBAND OPERATION

(75) Inventors: Edgar Schmidhammer, Stein an der Traun (DE); Pasi Tikka, Munich (DE)

(73) Assignee: Qualcomm Technologies, Inc., San Diego, CA (US)

( * ) Notice: Subject to any disclaimer, the term of this patent is extended or adjusted under 35 U.S.C. 154(b) by 339 days.

(21) Appl. No.: 13/578,801

(22) PCT Filed: Feb. 16, 2011

(86) PCT No.: PCT/EP2011/052289
§ 371 (c)(1),
(2), (4) Date: Sep. 25, 2012

(87) PCT Pub. No.: WO2011/104156
PCT Pub. Date: Sep. 1, 2011

(65) Prior Publication Data
US 2013/0009841 A1   Jan. 10, 2013

(30) Foreign Application Priority Data
Feb. 23, 2010   (DE) .................. 10 2010 008 920

(51) Int. Cl.
*H01Q 21/00*   (2006.01)
*H03H 7/38*   (2006.01)
*H03F 1/56*   (2006.01)
(Continued)

(52) U.S. Cl.
CPC ................ *H03H 7/38* (2013.01); *H03F 1/565* (2013.01); *H03F 3/24* (2013.01); *H03H 7/383* (2013.01); *H04B 1/0057* (2013.01); *H04B 1/52* (2013.01); *H03F 2200/111* (2013.01); *H03F 2200/387* (2013.01); *H03H 2007/386* (2013.01)

(58) Field of Classification Search
CPC ................................. H01Q 1/50; H01Q 21/00
USPC ......... 343/853, 861; 333/32–33, 101; 455/82, 455/132
See application file for complete search history.

(56) References Cited

U.S. PATENT DOCUMENTS 4,635,062 A * 1/1987 Bierig et al. .................. 342/372
6,151,509 A * 11/2000 Chorey ....................... 455/552.1
(Continued)

FOREIGN PATENT DOCUMENTS

DE   10 2008 003 445 A1   9/2008
DE   10 2008 033 663 A1   6/2009
(Continued)

OTHER PUBLICATIONS

Gustafsson, M., et al., "A Low Noise Figure 1.2-V CMOS GPS Receiver Integrated as a Part of a Multimode Receiver," IEEE Journal of Solid-State Circuits, vol. 42, No. 7, Jul. 2007, 9 pages.
(Continued)

*Primary Examiner* — Huedung Mancuso
(74) *Attorney, Agent, or Firm* — Smith Risley Tempel Santos LLC

(57) ABSTRACT

A broadband-operable impedance filter has capacitive elements of variable capacitance in the signal path, an inductive element in a parallel path connected in parallel to the signal path, and inductive elements in the ground path. The impedance filter allows communication in a first frequency band and the reception of HF signals in a second frequency band.

19 Claims, 3 Drawing Sheets

(51) Int. Cl.
*H03F 3/24* (2006.01)
*H04B 1/00* (2006.01)
*H04B 1/52* (2015.01)

(56) References Cited

U.S. PATENT DOCUMENTS

| | | |
|---|---|---|
| 6,798,287 B2 * | 9/2004 | Wu et al. .................. 330/129 |
| 7,389,090 B1 | 6/2008 | Kubota et al. |
| 8,185,062 B2 * | 5/2012 | Rofougaran et al. ........... 455/80 |
| 8,509,845 B2 * | 8/2013 | Park et al. ................. 455/553.1 |
| 2002/0151291 A1 * | 10/2002 | Toncich ...................... 455/274 |
| 2004/0075614 A1 | 4/2004 | Dakeya et al. |
| 2007/0194859 A1 | 8/2007 | Brobston et al. |
| 2009/0021325 A1 | 1/2009 | Lee et al. |
| 2009/0219216 A1 * | 9/2009 | Qi et al. ....................... 343/702 |
| 2011/0090021 A1 | 4/2011 | Scheele et al. |
| 2011/0298685 A1 | 12/2011 | Schmidhammer |

FOREIGN PATENT DOCUMENTS

| | | |
|---|---|---|
| DE | 10 2008 024 482 A1 | 11/2009 |
| DE | 10 2009 004 720 A1 | 7/2010 |
| EP | 1 513 261 A1 | 3/2005 |
| WO | WO 2009/141358 A1 | 11/2009 |
| WO | WO 2010/113746 A1 | 10/2010 |

OTHER PUBLICATIONS

International Search Report—PCT/EP2011/052289—ISA/EPO—May 17, 2011.

* cited by examiner

IMPEDANCE MATCHING CIRCUIT CAPABLE OF BROADBAND OPERATION

This patent application is a national phase filing under section 371 of PCT/EP2011/052289, filed Feb. 16, 2011, which claims the priority of German patent application 10 2010 008 920.6, filed Feb. 23, 2010, each of which is incorporated herein by reference in its entirety.

TECHNICAL FIELD

The invention relates to an impedance matching circuit that is capable of broadband operation and, in particular, embodiments allow transmission and reception in a first frequency band and also simultaneous reception in a further frequency band.

BACKGROUND

Abrupt changes in the impedance of an RF line result in reflections in the RF signal. In mobile communication appliances, impedance matching circuits match the antenna impedance to the impedance of the signal lines. If, by way of example, the antenna of a mobile communication appliance has a different impedance than the impedance of the signal line, the signal transmission from and to the antenna is subject to interference. In modern mobile communication appliances, antennas may be connected which have an impedance that is highly dependent on their physical surroundings. Changes in the surroundings of the antenna bring about a change in the antenna impedance. An impedance matching circuit which matches the variable antenna impedance to the impedance of subsequent stages of the mobile communication appliance is therefore frequently unavoidable.

An adaptive antenna matching network for impedance matching is known from the Patent Application US 2007/0194859 A1, for example. An impedance matching circuit which is connected between an antenna and the front-end module of a mobile communication appliance comprises adjustable-capacitance capacitive elements connected in the signal path and also inductive elements. In a "closed control loop" mode, good impedance matching is achieved in a narrow frequency range. In an "open control loop" mode, broadband matching is obtained, but with worsened insertion loss.

One problem of known impedance matching circuits is that the impedance matching generally relates to a single frequency band. In this frequency band, the impedance has good matching, but in other frequency bands it is possible neither to send nor to receive RF signals.

SUMMARY OF THE INVENTION

In one aspect, the present invention provides an impedance matching circuit which allows transmission and reception in a first frequency band and which at the same time allows at least the reception of signals in a second frequency band.

The invention specifies an impedance matching circuit which has a signal port, a load port and a signal path connected between the signal port and the load port. It also comprises a first and a second variable-capacitance capacitive element and also a first, a second and a third inductive element. The signal path contains a node. The first variable-capacitance capacitive element is connected between the signal port and the node. The second variable-capacitance capacitive element is connected between the node and the load port. The first inductive element connects the node to ground; the second inductive element connects the load port to ground. The third inductive element connects the signal port to the load port in a parallel path which is connected in parallel with the signal path.

Such an impedance matching circuit allows transmission and reception of RF signals in a first frequency band and the reception of RF signals in a second frequency band. In particular, it allows adaptive impedance matching in the first frequency band, in order to react to changes in the surroundings. Even if the impedance in the first frequency band is adaptively regulated, it is possible to receive received signals in the second frequency band without adaptive matching.

Such an impedance matching circuit is of simpler design than known matching circuits. It comprises fewer variable-impedance elements. As a result, it is cheaper to manufacture. Its variable-capacitance elements are limited to the signal path in terms of the arrangement of said elements. This allows the impedance to be adjusted using a simpler, faster and more robust algorithm.

In one refinement of the impedance matching circuit, the first inductive element has an inductance between 0.5 nH and 2 nH. The second inductive element has an inductance between 1 nH and 3 nH, and the third inductive element has an inductance between 1 nH and 3 nH. The adjustment range for the capacitance of the first variable-capacitance capacitive element is in the range from 0.5 pF to 3 pF. The adjustment range for the capacitance of the second variable-capacitance capacitive element is in the range from 1 pF to 10 pF. The adjustment ranges for the capacitive elements may make full use of the indicated ranges or may be subsets thereof.

In one embodiment, the load port is connected to a first antenna by means of a microstripline. The microstripline may be designed such that it also performs impedance matching itself.

In one embodiment, the impedance matching circuit is connected in a mobile communication appliance and allows transmission and reception in the 1 GHz band and at the same time reception in the 2 GHz band.

The first frequency band may be the 1 GHz frequency band, for example. The 1 GHz frequency band denotes the frequency range which is intended for mobile radio and which is situated essentially below 1 GHz or at frequencies around 1 GHz. By way of example, the second frequency band may be the 2 GHz band. The 2 GHz frequency band denotes the frequency range which is intended for mobile radio and which is situated essentially between the 1 GHz frequency range and the frequency range around 2 GHz. W-CDMA band 12 (transmission frequencies are situated between 698 and 716 MHz; reception frequencies are situated between 728 and 746 MHz) may be the first frequency band, for example. W-CDMA band 12 can be used to send and receive RF signals. In addition, the impedance matching circuit allows the reception of signals in W-CDMA band 1 between 2110 and 2170 MHz. Other bands, e.g., other W-CDMA bands, e.g., W-CDMA band 5, may likewise be the first band.

In one embodiment, adaptive regulation of the impedance matching is effected in the 1 GHz band by varying the values of the capacitances of the first and second variable-capacitance capacitive elements.

In one embodiment, the load port is connected to a first antenna. A switch is used to connect the load port to a second antenna. The switch connects the load port to the second antenna when the reception in the 2 GHz band is better via the second antenna than via the first antenna.

As already mentioned above, the impedance of an antenna can vary. If a mobile communication appliance comprises two antennas, the reception in a particular frequency band may be better via the second antenna than via the first antenna, the first antenna being used to transmit transmission signals and received signals in the first frequency range.

In one embodiment, the 1 GHz band is used to send and receive call data. The 2 GHz band is used to receive a diversity signal. A diversity signal is an additional received signal which can improve the signal quality, for example.

In one embodiment, it is possible to receive a signal which, in addition to signals which transmit call data. By way of example, an additional received signal may be a received GPS signal or a received broadcast radio signal.

BRIEF DESCRIPTION OF THE DRAWINGS

The impedance matching circuit is explained in more detail below with reference to exemplary embodiments and associated schematic figures, in which.

DETAILED DESCRIPTION OF ILLUSTRATIVE EMBODIMENTS

Figure 1:
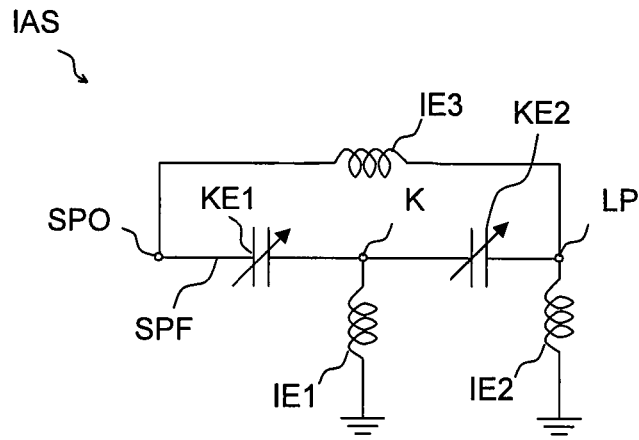
FIG. 1 shows a basic form of the impedance matching circuit.

FIG. 1 shows an impedance matching circuit IAS according to the invention. A node K is arranged between the signal port SPO and the load port LP in the signal path SPF. A first variable-capacitance inductive element IE1 connects the node K to ground. A second inductive element IE2 connects the load port LP to ground. The signal port SPO and the node K have a first variable capacitive element KE1 connected between them. The node K and the load port LP have a second variable-capacitance capacitive element KE2 connected between them. A parallel path, which is connected in parallel with the signal path SPF and connects the signal port SPO to the load port LP, has a third inductive element IE3 connected in it. The signal port SPO may be connected to subsequent stages of a mobile communication appliance, e.g., a front-end circuit, filter circuits or amplifier circuits. The load port LP may be connected to an antenna of the relevant communication appliance in which the matching circuit may be connected.

Figure 2:
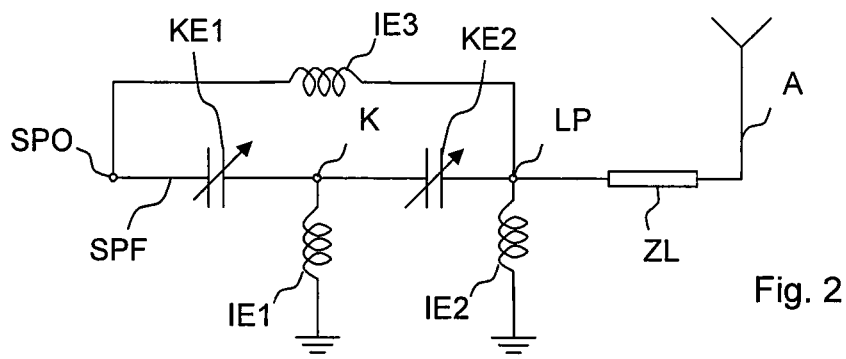
FIG. 2 shows an impedance matching circuit which is connected to an antenna by means of a microstripline.

FIG. 2 shows the impedance matching circuit from FIG. 1, wherein the load port LP is connected to an antenna A by means of a further element, e.g., a supply line ZL. By way of example, the further element may be a microstripline.

Figure 3:
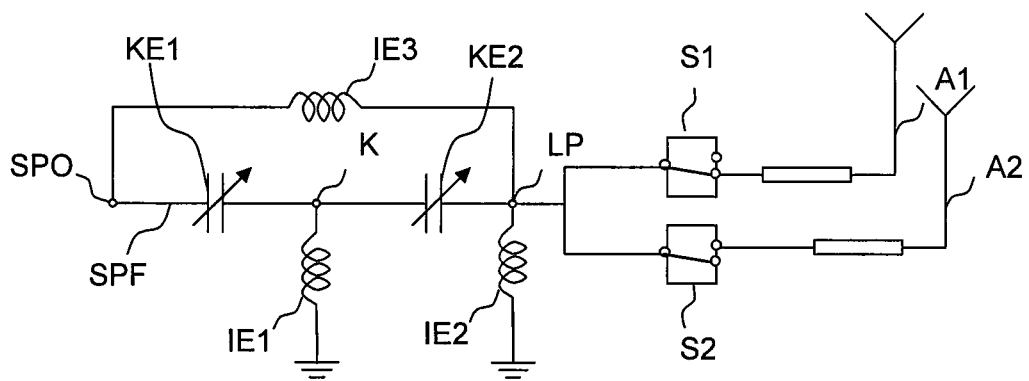
FIG. 3 shows an impedance matching circuit which is connected to two antennas.

FIG. 3 illustrates the connection of the impedance matching circuit to two different antennas A1, A2. Switches S1, S2 can be used to connect the load port LP exclusively to the first antenna A1 or exclusively to the second antenna A2 or to both antennas A1 and A2. It is advantageous to connect the load port to that antenna which has the better transfer characteristics. The usual methods, e.g., using detector circuits which ascertain their respective standing wave ratio, can be applied in order to obtain the matching for the respective antennas.

Figure 4:
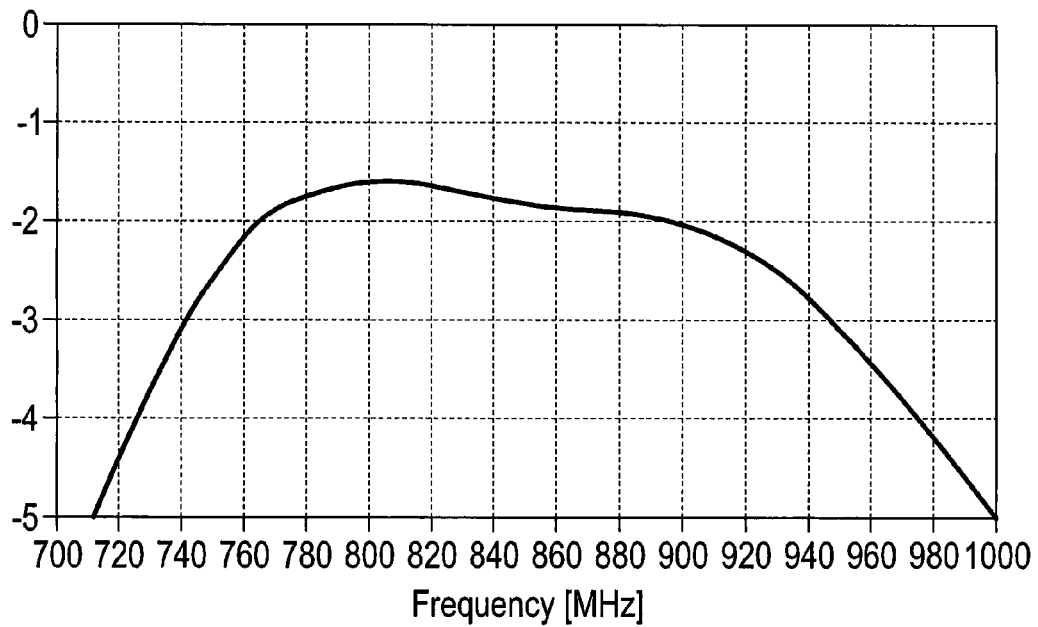
FIG. 4 shows the insertion loss of the signal path in a first frequency range.

FIG. 4 illustrates the frequency-dependent profile of the insertion loss of the signal path in a frequency range between 710 and 1000 MHz in dB. Particularly in the frequency range between 770 and 900 MHz, the insertion loss is better than −2 dB. The insertion loss shown allows the transmission and reception of RF signals, e.g., for the purpose of communication. Adaptive matching of the impedance in the first frequency band is possible without the need for adaptive matching in the second frequency band. The reason is that broadband matching is obtained in the second frequency band. In addition, however, it is possible for the impedance in the second frequency band to be adaptively matched in order to further improve the reception in the second frequency band.

Figure 5:
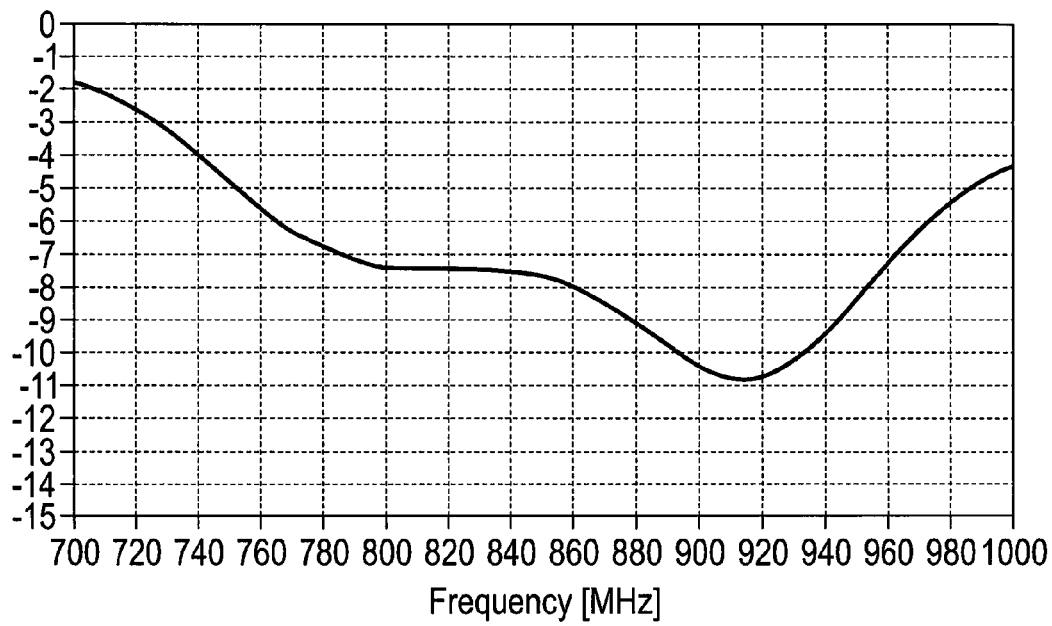
FIG. 5 shows the reflection coefficient of the signal path in the first frequency range.

FIG. 5 illustrates the reflection coefficient of the signal path with an impedance matching circuit according to the invention in the frequency range from 700 MHz to 1000 MHz in dB. Particularly in the frequency range between 780 MHz and 960 MHz, the reflection coefficient is better than −6 dB.

Figure 6:
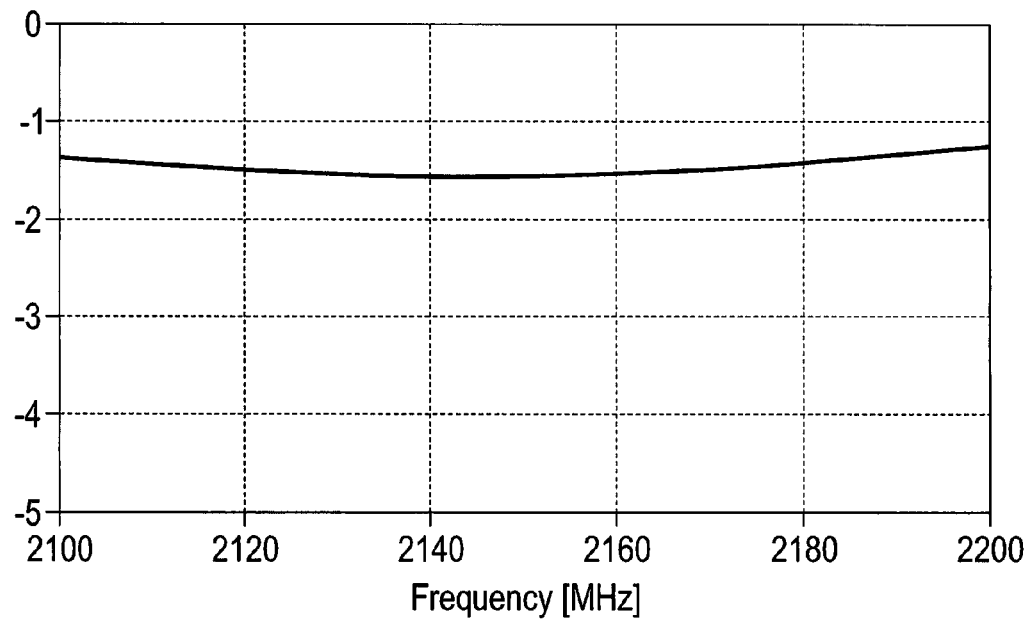
FIG. 6 shows the insertion loss of the signal path in a second frequency range.

FIG. 6 illustrates the insertion loss in the frequency range from 2100 to 2200 MHz as a second frequency band in dB. In this case, the insertion loss is essentially constant at approximately −1.4 dB. Hence, sufficiently good reception in the 2 GHz frequency band and transmission and reception operation at frequencies between 700 MHz and 1000 MHz as a first frequency band are simultaneously possible.

Figure 7:
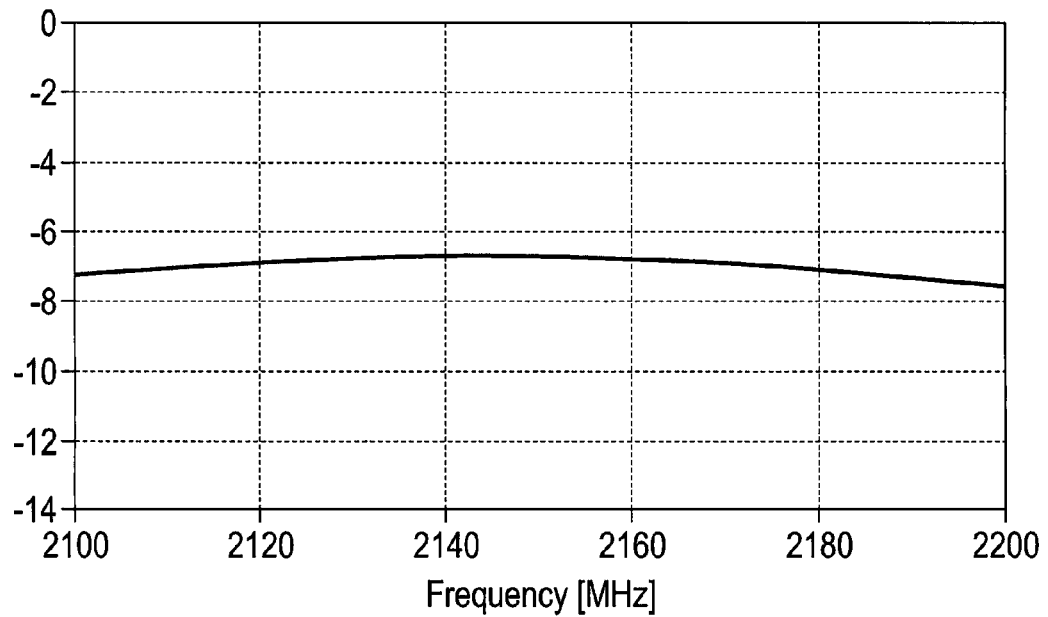
FIG. 7 shows the reflection coefficient of the signal path in the second frequency range.

FIG. 7 illustrates the frequency-dependent profile of the reflection coefficient of a signal path configured according to the invention in the frequency range between 2100 and 2200 MHz. In this case, the reflection coefficient is essentially constant at approximately −7 dB.

The profiles of the insertion loss which are shown in FIGS. 4 and 6, said profiles being achieved simultaneously, clearly show that it is possible to transmit RF signals in different frequency bands. In particular, it is possible to obtain good insertion loss in the first frequency range and, by varying the capacitances of the adjustable capacitive elements, to obtain matching to different antenna impedances and at the same time to maintain communication in the second frequency band.

An impedance matching circuit is not limited to one of the exemplary embodiments described. Variations which, by way of example, comprise yet further capacitive, inductive or resistive elements in the specified signal or ground paths or in further signal or ground paths are likewise exemplary embodiments according to the invention.

The invention claimed is:

1. An impedance matching circuit, comprising:
  a signal port;
  a load port for coupling to at least one antenna;
  a signal path coupled between the signal port and the load port;
  an intermediate node arranged in the signal path;
  a first variable-capacitance capacitive element coupled between the signal port and the intermediate node;
  a second variable-capacitance capacitive element coupled between the intermediate node and the load port;
  a first inductive element coupled between the intermediate node and a ground node;
  a second inductive element coupled between the load port and the ground node; and
  a third inductive element coupled between the signal port and the load port in a parallel path parallel to the signal path.

2. The impedance matching circuit according to claim 1, wherein the first inductive element has an inductance between 0.5 nH and 2 nH, the second inductive element has an inductance between 1 nH and 3 nH, and the third inductive element has an inductance between 1 nH and 3 nH.

3. The impedance matching circuit according to claim 2, wherein an adjustment range of capacitance for the first variable-capacitance capacitive element is in the range from 0.5 pF to 3 pF and the adjustment range of capacitance of the second variable-capacitance capacitive element is in the range from 1 pF to 10 pF.

4. The impedance matching circuit according to claim 1, wherein an adjustment range of capacitance for the first variable-capacitance capacitive element is in the range from 0.5 pF to 3 pF and the adjustment range of capacitance of the second variable-capacitance capacitive element is in the range from 1 pF to 10 pF.

5. The impedance matching circuit according to claim 1, wherein the load port is configured to be coupled to the at least one antenna via a microstripline.

6. The impedance matching circuit according to claim 1, wherein the at least one antenna includes a first antenna and a second antenna, and the load port is configured to be selectively coupled to the first antenna and/or the second antenna via a switching unit.

7. The impedance matching circuit according to claim 1, further comprising a microstripline coupled to the load port.

8. The impedance matching circuit according to claim 7, wherein the load port is coupled to the at least one antenna via the microstripline.

9. The impedance matching circuit according to claim 1, wherein the impedance matching circuit is connected in a mobile communication appliance and allows transmission and reception in the 1 GHz band and at the same time reception in the 2 GHz band.

10. The impedance matching circuit according to claim 9, wherein adaptive regulation of the impedance matching takes place in the 1 GHz band by variation of capacitances of the first and second variable-capacitance capacitive elements.

11. The impedance matching circuit according to claim 9, wherein call data are sent and received in the 1 GHz band and a diversity signal is received in the 2 GHz band.

12. The impedance matching circuit according to claim 1, wherein:
the at least one antenna includes a first antenna and a second antenna;
the load port is coupled to the first antenna and wherein the load port is coupled to a second antenna via a switch; and
the switch couples the load port to the second antenna when reception in the 2 GHz band is better via the second antenna than via the first antenna.

13. The impedance matching circuit according to claim 1, wherein call data are sent and received in the 1 GHz band and a diversity signal is received in the 2 GHz band.

14. The impedance matching circuit according to claim 1, further comprising a first switch coupled to the load port and a second switch coupled to the load port.

15. The impedance matching circuit according to claim 14, wherein the at least one antenna includes a first antenna and a second antenna, and the load port is coupled to the first antenna through the first switch and the load port is coupled to the second antenna through the second switch.

16. The impedance matching circuit according to claim 15, further comprising a first microstripline coupled between the load port and the first antenna and a second microstripline coupled between the load port and the second antenna.

17. A circuit, comprising:
a signal port;
a load port;
a signal path coupled between the signal port and the load port;
an intermediate node arranged in the signal path;
a first variable-capacitance capacitive element coupled between the signal port and the intermediate node;
a second variable-capacitance capacitive element coupled between the intermediate node and the load port;
a first inductive element coupled between the intermediate node and a ground node;
a second inductive element coupled between the load port and the ground node;
a third inductive element coupled between the signal port and the load port in a parallel path parallel to the signal path;
an antenna coupled to the load port; and
a microstripline coupled between the load port and the antenna.

18. A circuit, comprising:
a signal port;
a load port;
a signal path coupled between the signal port and the load port;
an intermediate node arranged in the signal path;
a first variable-capacitance capacitive element coupled between the signal port and the intermediate node;
a second variable-capacitance capacitive element coupled between the intermediate node and the load port;
a first inductive element coupled between the intermediate node and a ground node;
a second inductive element coupled between the load port and the ground node;
a third inductive element coupled between the signal port and the load port in a parallel path parallel to the signal path;
a first antenna coupled to the load port;
a second antenna coupled to the load port;
a first switch coupled between the load port and the first antenna; and
a second switch coupled between the load port and the second antenna.

19. The circuit according to claim 18, further comprising:
a first microstripline coupled between the first switch and the first antenna; and
a second microstripline coupled between the second switch and the second antenna.

* * * * *